US006095279A

United States Patent [19]

Adamson

[11] Patent Number: 6,095,279

[45] Date of Patent: Aug. 1, 2000

[54] LOUDSPEAKER SYSTEM

[76] Inventor: Alan Brock Adamson, 2354 Passmore Ave., Scarborough, Ontario, Canada, M1X 1P8

[21] Appl. No.: 09/303,553

[22] Filed: May 3, 1999

Related U.S. Application Data

[62] Division of application No. 08/509,361, Jul. 31, 1995, Pat. No. 5,900,593.

[51] Int. Cl.$^{7}$ ........ H05K 5/00

[52] U.S. Cl. ........ 181/152; 181/144

[58] Field of Search ........ 181/152, 199, 181/144, 148, 156, 159, 160

[56] References Cited

U.S. PATENT DOCUMENTS

| | | | |
|---|---|---|---|
| 3,138,220 | 6/1964 | Glindmeyer | 181/199 |
| 4,014,597 | 3/1977 | Griffin, Jr. | 181/199 |
| 4,805,730 | 2/1989 | O'Neil et al. | 181/199 |
| 4,811,403 | 3/1989 | Henricksen et al. | 181/152 |
| 4,815,559 | 3/1989 | Shirley | 181/144 |
| 4,862,508 | 8/1989 | Lemon . | |
| 5,000,286 | 3/1991 | Crawford et al. | 181/199 |
| 5,163,167 | 11/1992 | Heil . | |
| 5,526,456 | 6/1996 | Heinz | 181/152 |
| 5,552,569 | 9/1996 | Sapkowski | 181/199 |

*Primary Examiner*—Khanh Dang

*Attorney, Agent, or Firm*—Dowell & Dowell, P.C.

[57] ABSTRACT

A loudspeaker system including at least one enclosure incorporating a wave guide having a curved input slot through which sound waves generated from an acoustic transducer are introduced by way of an acoustic chamber and wherein the curvature of the slot and the orientation of opposite side walls of the enclosure are such that sound ways propagated within the wave guide exit the wave guide in a geometric configuration of a segment of a torus and so that sound waves from side-by-side enclosures form a common non-interfering wavefront.

13 Claims, 14 Drawing Sheets

FIG. 4A
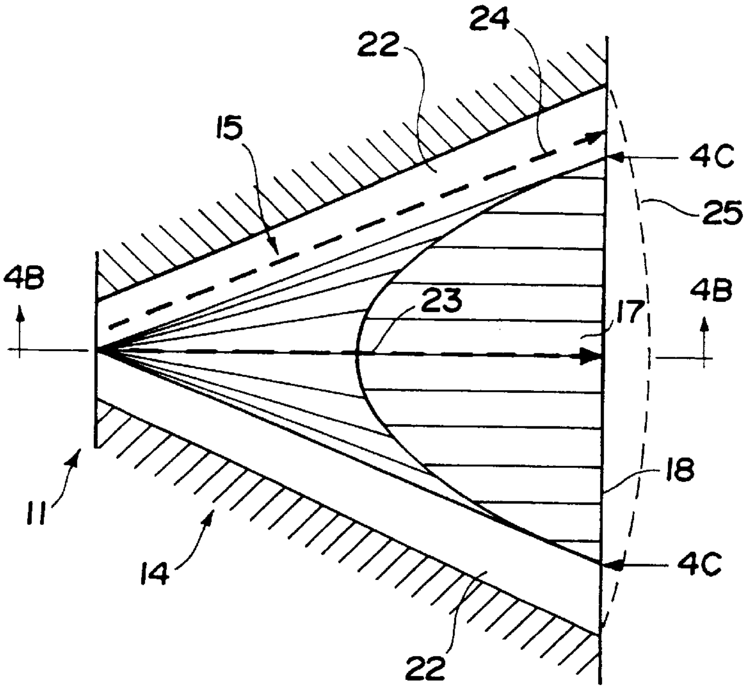
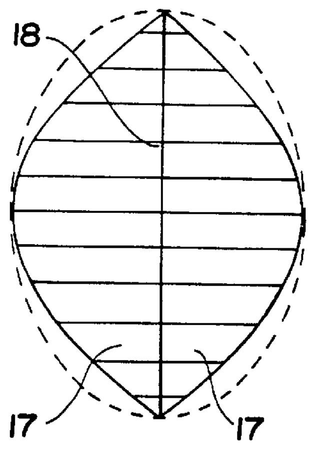
FIG. 4C
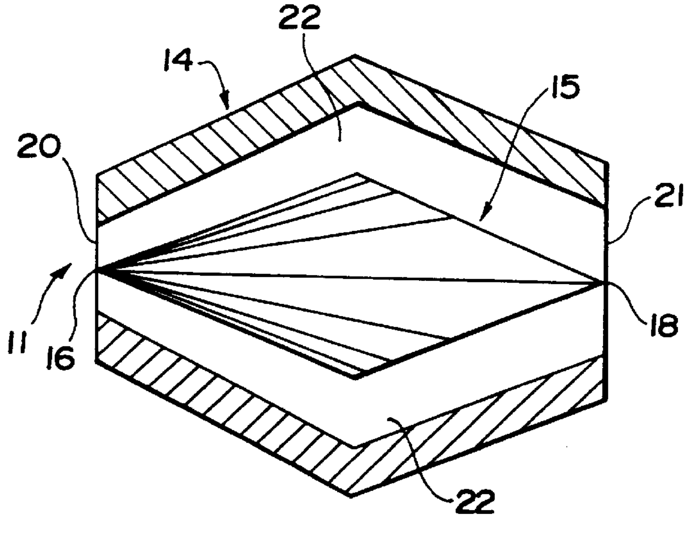
FIG. 4B

FIG. 6A
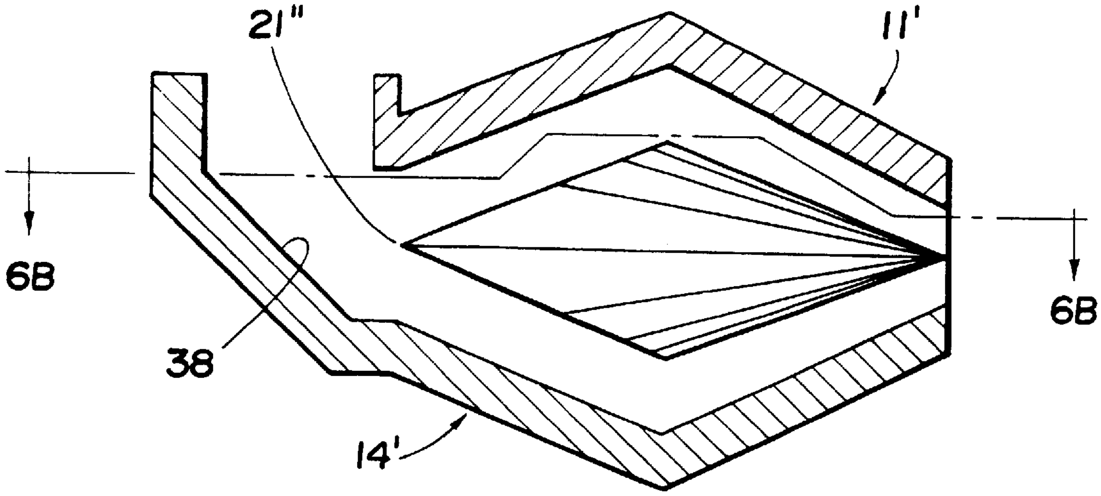
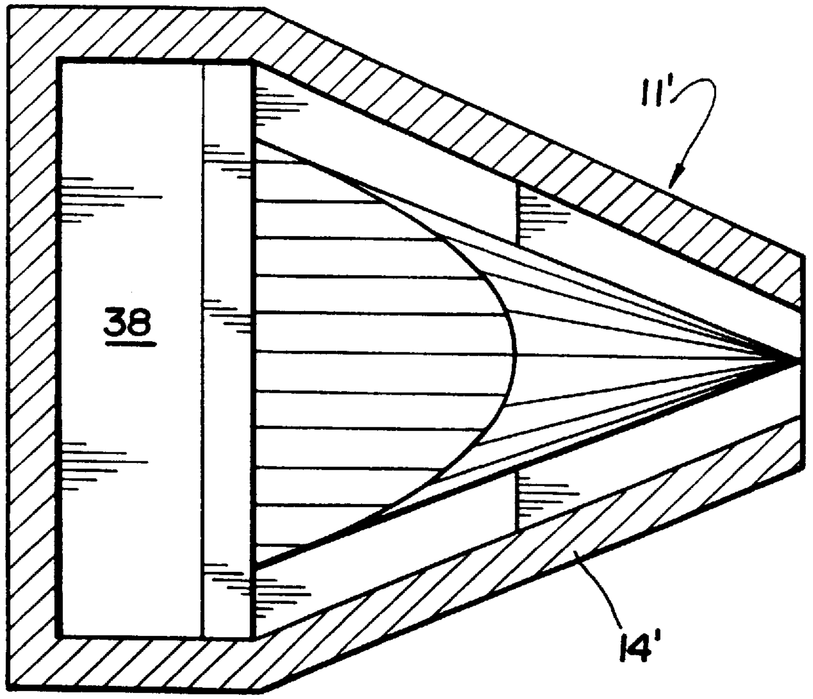
FIG. 6B

LOUDSPEAKER SYSTEM

This application is a divisional of application Ser. No. 08/509,361, filed on Jul. 31, 1995, now U.S. Pat. No. 5,900,593.

BACKGROUND OF THE INVENTION

1. Field of the Invention

This invention is generally directed to loudspeakers and loudspeaker systems and, more particularly, to one or more loudspeaker enclosures having horizontal cross-sections of a trapezoidal or wedge shape configuration and having horizontal curved input slots which extend between the side walls thereof wherein one or more electro-acoustic transducers are housed within each enclosure and which operate in one or more band limited frequency ranges having horizontal boundaries defined by the side walls of the enclosures such that the wavefront emitting from the transducers is converted from a circular isophase wavefront to a curved ribbon wavefront approximating the shape of a section of the surface of a toroid. The wavefronts of a plurality of enclosures form a common or continuous wavefront.

2. History of the Invention

In public and private venues, used for performance, sport, business and other applications, and in particular where people gather in large numbers, loudspeakers are generally found. Where the venue is sufficiently large and the program material demands, such loudspeakers are often found in multiples, since a single loudspeaker will often not meet the technical requirements of sound pressure, uniformity of coverage and uniformity of frequency response. These multiple groups of loudspeakers are referred to as arrays.

Most loudspeakers used in arrays are designed foremost as individual loudspeakers and perform best when used alone.

Such loudspeakers generally approximate a point source in space and form an approximate spherical radiation pattern. When applied in increasing numbers, the plurality of point sources create significant interference patterns and the quality of reproduction deteriorates significantly.

A proposed solution to this problem is presented in U.S. Pat. No. 4,862,508 which discloses "a plurality of individual sources, each of a constant directivity type." However, it can be shown that the apex of such a system is not common with the apex of the individual elements of the system and therefore represents multiple overlapping sources which create interference. It can be further shown that because the audio spectrum is very broad, typically ranging over eleven octaves or doublings of wavelength, that the physical size and spacing of the lower frequency transducers interferes with the optimal spacing and placement of the smaller high frequency transducers. Simple analysis will reveal therefore that such a system will not perform as disclosed. Indeed, several systems are currently in production and do not meet the performance criteria set forth in this patent. Such systems clearly perform as multiple source systems.

Another proposed solution is disclosed in U.S. Pat. No. 5,163,167 to Heil which utilizes a manifold or chamber to create a rectangular planar wave which results in a vertical cylindrical radiation pattern. The high frequency and mid frequency elements of the system are introduced into a common waveguide which is placed in a rectangular enclosure. Such enclosures may then be added one above another in columnar fashion, thus creating a longer vertical rectangular planar wave which will maintain its cylindrical radiation pattern. It may be said therefore that the system performs as a single unit comprised of individual pieces.

There are limits, however, to the vertical rectangular flat or planar wave approach. The cylindrical nature of the pattern fixes the horizontal beam width and the chamber design does not allow curving of the wavefront. Also, the enclosure design does not allow the curving of the whole system without creating signification gaps between enclosures which degrade system response. Further, in greater numbers, a decrease in vertical beam width occurs so that two such vertical arrays may not be placed next to each other (side by side) without creating destructive interference.

Further prior art teaches a system wherein multiple drivers in the high frequency band and the mid frequency band are introduced into a common waveguide which is placed in a single trapezoidal enclosure to provide a point source which is fed by a plurality of drivers. However, when multiples of these enclosures are arrayed in a single system, the same multiple point source destructive interference is encountered.

SUMMARY OF THE INVENTION

The present invention is comprised of loudspeaker enclosures whose horizontal cross section is trapezoidal or wedge shaped. Each loudspeaker enclosure must contain at least one compression driver, typically high frequency, and/or at least one mid range transducer, such as a cone type loudspeaker, which are affixed to sound chambers whose exit approximates a curved slot, which slot extends from one vertical side wall of the enclosure to the other, which is in turn affixed to a waveguide whose vertical boundaries are the side walls of the loudspeaker enclosure and whose horizontal boundaries are predetermined based on the desired vertical beam width of the loudspeaker system.

In some embodiments, at least one low frequency direct radiating loudspeaker, operating at such wavelengths (frequency), may be placed within the loudspeaker enclosures of the loudspeaker system such that the transducers are closely coupled to one another (i.e., within approximately one wavelength) such that they are operate uniformly and without interference with one another.

The horizontal cross-section of the enclosures of the present invention is trapezoidal. When more than one enclosure is placed in use, it is done so with the adjacent sides of the enclosure touching one another. The throat or entrance of the waveguide, which is fed by the sound chamber(s), comprises a horizontal slot which is curved to match the radius of the array of enclosures.

The throat extends from one of the vertical side walls of the enclosure(s) to the opposing vertical wall. Further, the side walls of the enclosure thereby form the side walls of a waveguide. Since the walls of the enclosure and waveguide are oriented radially from the center of the array and the radius of the throat curvature is the same, the wavefront intersects with the wall of the waveguide approximately at a 90 degree angle. The wavefronts of a plurality of enclosures and waveguides in this manner form a common wavefront without interference.

In one embodiment, the radiating curved slot of the high frequency driver is placed at the top of the enclosure and the top of the enclosure forms the top wall of the waveguide. In order to create a more powerful system a second row of enclosures may be inverted and placed on top of the first row of enclosures. The resultant double row array is made possible without interference because the two waveguides and their respective throats are separated only by the thickness of the top walls of the two respective enclosures.

The high frequency sound chamber of the present invention transforms a circular planar isophase sound wave at the output of a typical high frequency compression driver into a curved wavefront, the shape of the surface of which resembles a section of the surface of a toroid. The exit of such a chamber is mounted to the waveguide so as to allow the continuous undistorted growth in the area of the wavefront while maintaining the toroidal shape of the wavefront at its exit. The positioning of a plurality of waveguides and chambers adjacent one another allows for the creation of a coherent wavefront which is essentially toroidal in shape, but with a proportional increase in the included horizontal angle.

Further, the high frequency sound chamber may, if desired, cause the wavefront to exit the sound chamber in a direction substantially altered from the original direction of the wavefront at the output of the compression driver. Typically the direction of the wavefront at the exit would be turned 90° from the direction of the wavefront at the entrance to the sound chamber.

In the preferred embodiments, the high frequency sound chamber includes an outer shell and an inner body which is positioned within the outer shell so as to form sound spaces or conduits between an entrance or orifice from which sound is received from a compression driver and an exit orifice wherein the wave fronts exiting therefrom are curved. The inner body is preferably formed from an elliptical or compressed cone having a pointed end extending toward the inlet orifice and an outer end which is bevelled on opposite sides so as to form an elongated edge aligned with the exit orifice. The bevelled portions of the inner body extend approximately half the length of the cone. Due to the shorter distance measured from the tip of the cone to the center of the edge of the opposite side of the cone when compared to the distance between the point of the cone and the outer sides of the edge formed at the opposite side of the cone. The sound waves passing through the passages aligned over the shorter distance will emanate the exit prior to the sound waves following the longer passageways, thus creating a curved wavefront at the exit orifice. In one embodiment, the sound waves may be channeled in an arcuate passage so as to redirect the wavefront substantially 90° from the inlet orifice where in another embodiment, the sound is reflected at 90° after passing from the outlet orifice.

The speaker system of the present invention may further include at least one mid-range sound chamber wherein sound travels through a labyrinth of small, equal-length passages generally in an upward direction to align where each of the passages join and then are angled toward the throat of the waveguide of the enclosure. The sound is emanated from a conventional cone-type loudspeaker which is mounted within the enclosure in facing relationship to the front thereof.

An object of the present invention to provide a method to create one or more wavefronts, in one or more frequency ranges within a loudspeaker enclosure, which will merge with the wavefront(s) of the same frequency range of an adjacent similar loudspeaker enclosure with virtually zero acoustical interference.

It is a further object of the present invention to provide a method which allows more than one transducer operating in the same frequency range to produce a common wavefront within the same waveguide with virtually zero acoustical interference.

It is a further object of the present invention to provide a means to create an optimal transformation of the shape of a sound wave between the exit of a compression driver and the entrance of its associated waveguide by means of particular sound chambers.

It is a further object of the present invention to provide a means to create an optimal transformation of the shape of a sound wave between the diaphragm of a midrange cone and dome type transducer and the entrance of its associated waveguide by means of particular sound chambers.

BRIEF DESCRIPTION OF THE DRAWINGS

FIG. 4*a* is a cross-sectional view through a first embodiment of sound chamber in accordance with the teachings of the present invention;

FIG. 4*b* is a side cross-sectional view of the embodiment shown in FIG. 4*a;*

FIG. 4*c* is an end view of the body mounted within the sound chamber shown in FIGS. 4*a* and 4*b;*

FIG. 6*a* is a cross-sectional view of another sound chamber in accordance with the teachings of the present invention wherein the sound wave path is reflected to an exit orifice;

FIG. 6*b* is a top cross-sectional view of the embodiment of FIG. 6*a;*

DESCRIPTION OF THE PREFERRED EMBODIMENT

The Enclosure and Waveguides

Figure 1:
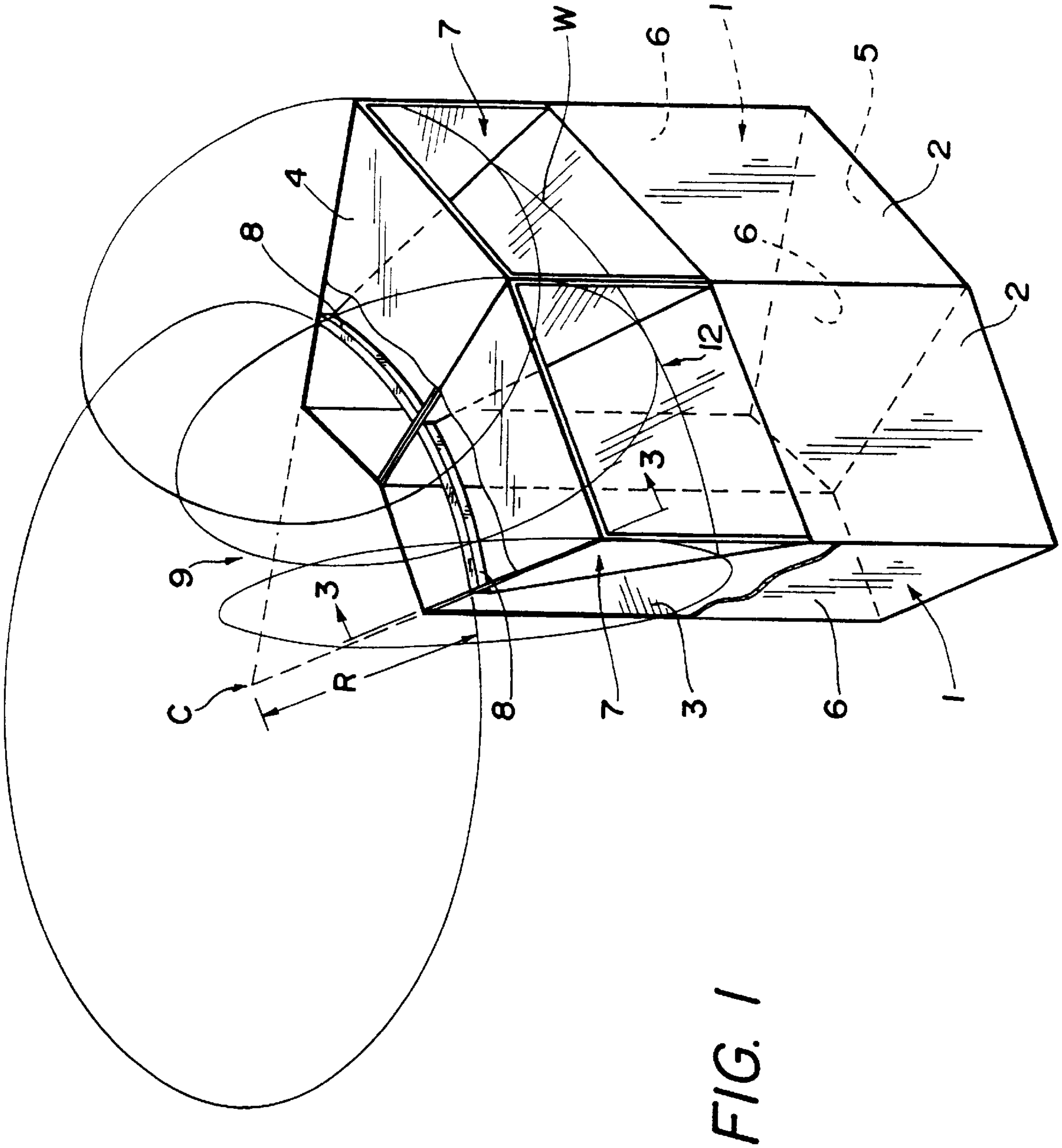
FIG. 1 is a perspective illustrational view of two sound enclosures disposed in side-by-side relationship which incorporate features of the present invention.
Figure 2:
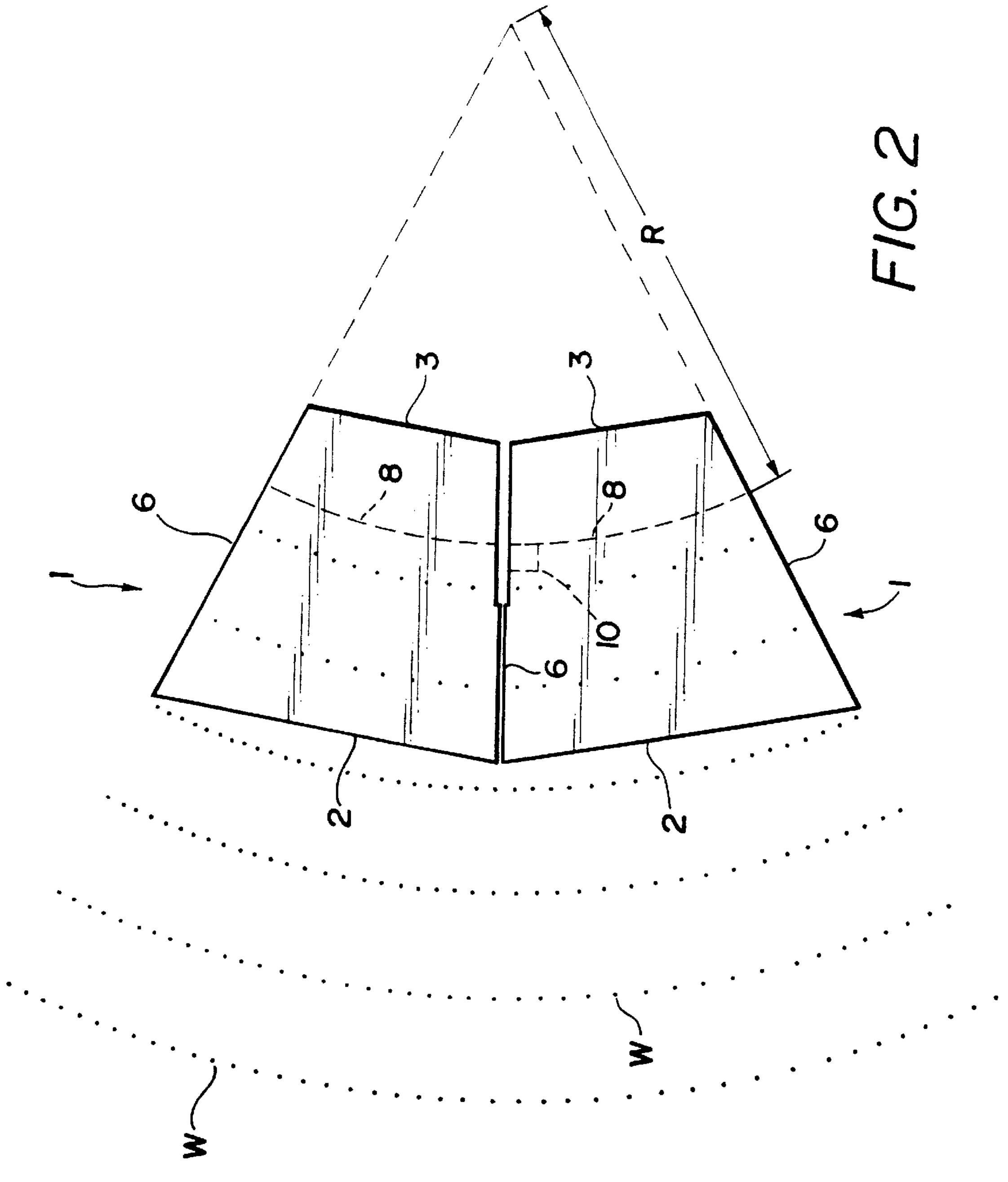
FIG. 2 is a schematic illustrational top plan view of the enclosures shown in FIG. 1 illustrating the sound wave pattern emanating from the enclosures.

The present invention includes enclosures 1 which in horizontal cross-section are trapezoidal. Such enclosure includes front and rear walls 2 and 3, respectively, an upper wall 4, lower wall 5 and sides walls 6. When more than one enclosure is placed in use it is done so with the adjacent sides of the enclosures touching one another. At least one waveguide 7 is provided within each enclosure and has side walls defined by the side walls 6 of the enclosure and upper and lower walls which will be described in greater detail hereinafter. The throat or entrance 8 of the waveguide, which is fed by one or more sound chambers, comprises a horizontal slot which is curved to match the radius "R" of an array of enclosures 9. The slots may be open or a series of apertures.

The throat 8 extends from one of the vertical side walls 6 of the cabinet to the opposing vertical wall. Since the walls of the enclosure and waveguide are oriented radially from the center "C" of the array and the center of the radius of the throat curvature is the same, the wavefront intersects with the wall of the waveguide at substantially a right angle (90°), as shown at 10, and propagates without interference or distortion within the waveguide. The wavefronts of a plurality of enclosures and waveguides in this manner form a common wavefront "W".

Figure 3:
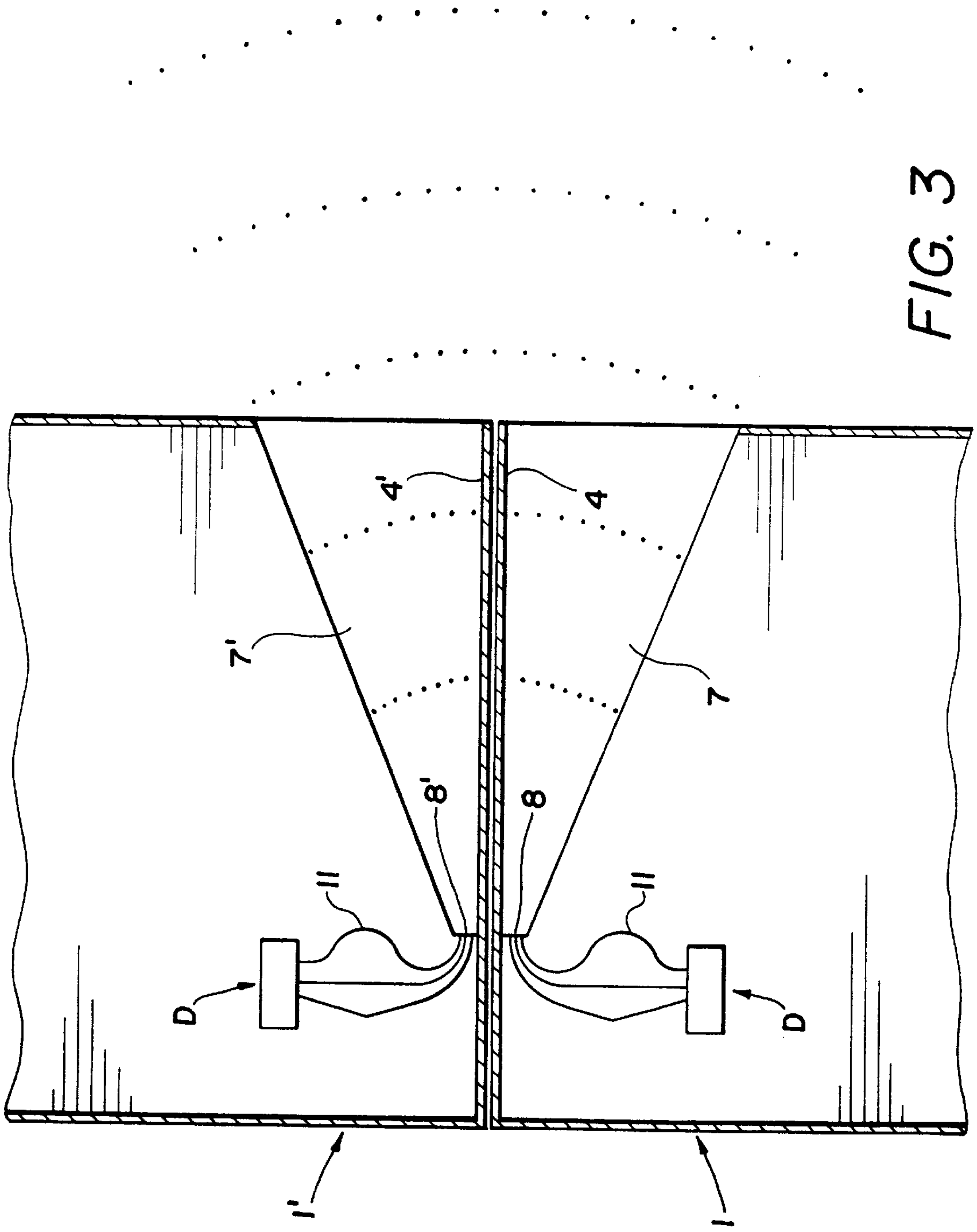
FIG. 3 is a side cross-sectional view of two sound enclosures similar to those shown in FIG. 1 stacked one on top of the other showing interior wave guides to which separate sound chambers and electro-acoustic transducers are mounted.

In the preferred embodiment, the radiating curved slot of a high frequency driver 11 is placed at the top of the enclosure and the top of the enclosure forms the top wall of the waveguide. In order to create a more powerful system a second row of enclosures may be inverted and placed on top of the first row of enclosures, as shown in FIG. 3. The resultant double row array is made possible without interference because the two waveguides 7 and 7' and their respective throats 8 and 8' are separated only by the thickness of the upper walls 4 and 4' of the two respective enclosures 1 and 1'.

High Frequency Sound Chamber

The high frequency sound chamber transforms a circular planar isophase sound wave at the output of a typical high frequency compression driver "D", as shown in FIG. 3, into a toroidal wavefront 12, as shown in FIG. 1. The waveguide 7 attached to the exit of such a chamber allows the continuous undistorted growth in the area of the wavefront while maintaining the toroidal wavefront at its exit. The positioning of a plurality of waveguides and chambers adjacent one another allows for the creation of a coherent wavefront which is essentially toroidal in shape, but with a proportional increase in the included horizontal angle.

Further, in the preferred embodiment, the high frequency sound chamber may, if desired, cause the wavefront to exit the sound chamber in a direction substantially altered from the original direction of the wavefront at the output of the compression driver. Typically, the direction of the wavefront at the exit would be turned 90° from the direction of the wavefront at the entrance to the sound chamber.

As shown in FIGS. 4A, 4B and 4C, the sound chamber 11 consists of an outer shell 14 and an inner body 15. The geometric composition is such that the body can be generally described as having an outer surface comprised of an elliptical cone, non-circular in cross section, which has been cut away equally on two sides at its large end by two plane surfaces 17 which extend from the center of the large end of the cone to a point on the side of the cone midway along the axial length of the cone, such that the two planes intersect forming a wedge 18 at the large end of the cone and describe a parabola when viewed from the side.

The shell may be generally described as having an inner surface which is offset outward from the surface of the inner body, a distance which is constant from the surface of the inner body at any given distance from the entrance orifice 20 as may be measured on any side of the body.

The pointed end of the body 16 (i.e., pointed end of the cone), is positioned at the circular entrance orifice 20 of the shell and the wedge shaped end 18 of the inner body is placed at a rectangular exit orifice 21 of the shell.

The shell has solid walls and is sealed acoustically and is comprised of an acoustically impervious inner surface except for the entrance orifice which is circular and the exit orifice which is rectangular. The inner body is of similar geometric size and has an acoustically impervious outer surface and is fixed in a position within the shell equidistant from the inner walls of the shell, thus forming passages or conduits 22 for the passage of sound between the outer shell and the inner body. The body is fixed so that the sound may pass through the passages or conduits on all sides of the body and against the entire inner surface of the shell.

The shell and inner body may be so sized that the passages or conduits for the passage of sound is uniformly tapered from the entrance orifice 20 to the exit orifice 21 so that the exit orifice is larger than the entrance orifice.

The shell and the inner body may be further so shaped that any direct path which any part of a wavefront may take from the entrance orifice is unequal and varies according to the aspect ratio of the elliptical inner body. In particular, the sound path 23 over the middle of the body is somewhat shorter than the pathlength 24 along the side of the body. Thus the wavefront emerges as a curved wavefront 25, as shown in FIG. 4A.

A further aspect of the present invention, which includes its preferred embodiment, is that the direction of the wavefront may be altered from its original direction at the entrance orifice of the sound chamber.

Figure 5B:
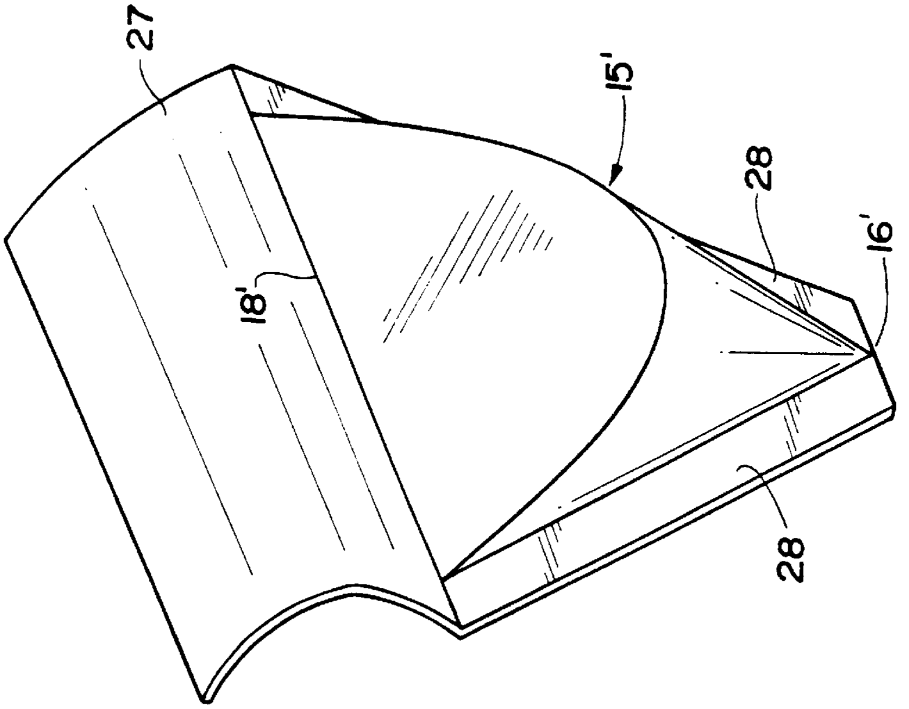
FIG. 5*b* is a perspective view of the body mounted within the housing of the sound chamber of FIG. 5*a;*
Figure 5A:
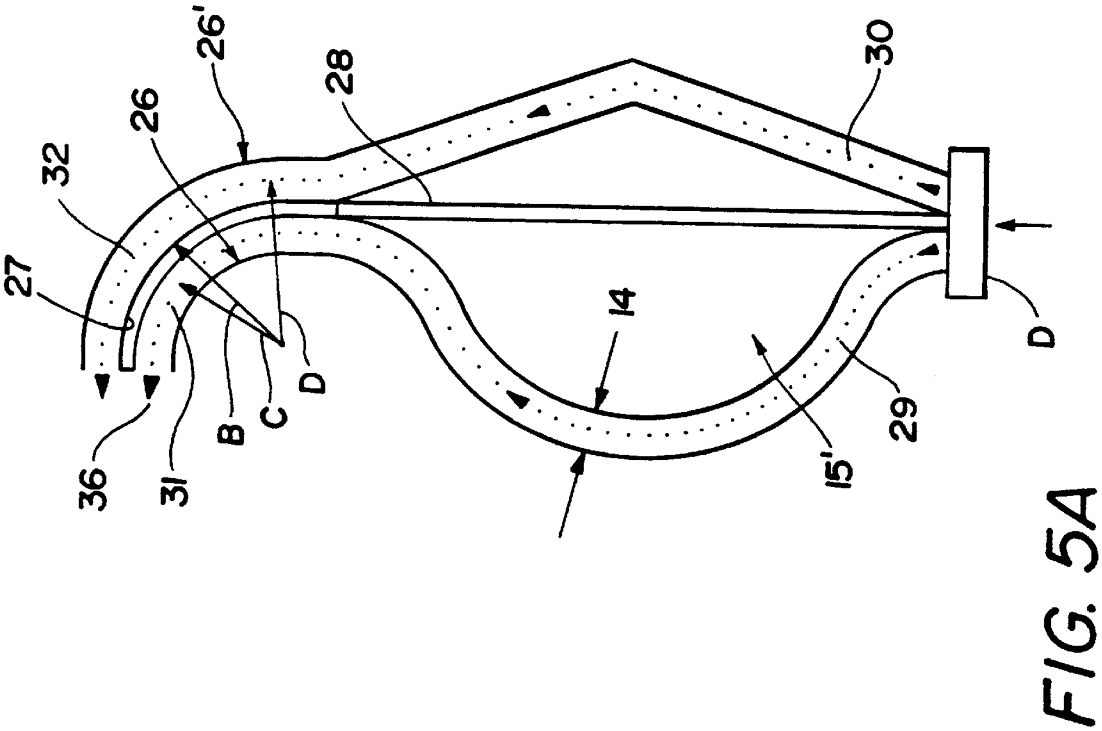
FIG. 5*a* is a cross-sectional view through another embodiment of sound chamber having a body similar to that shown in FIGS. 4*a–c* and including an outer flange for separating the sound wave paths through the sound chamber.
Figure 5C:
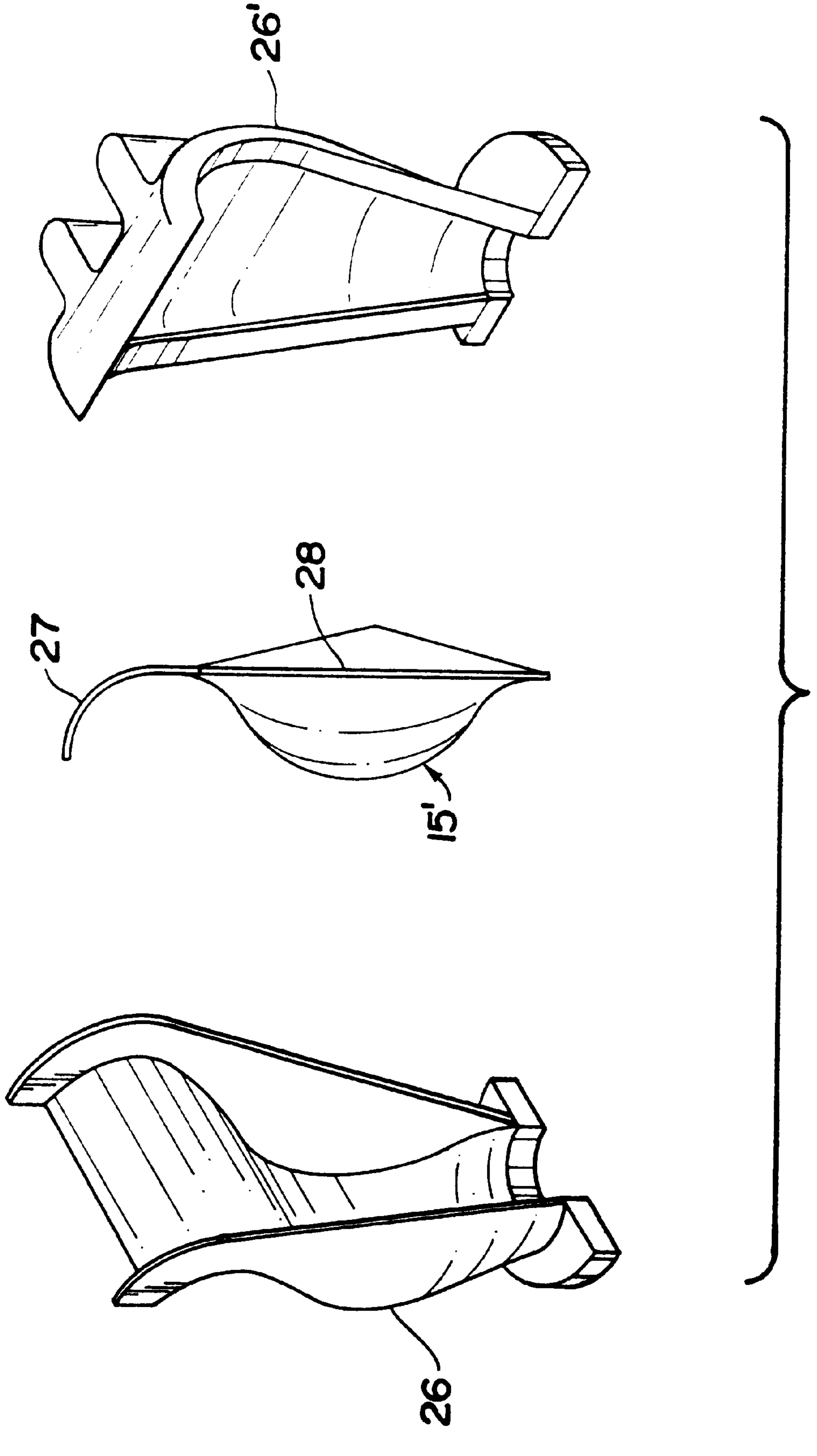
FIG. 5*c* is an assembly view of the sound chamber shown in FIGS. 5*a* and 5*b;*

As shown in FIGS. 5A, 5B and 5C, the shell is generally comprised of two or more pieces 26 and 26', with a uniform dividing membrane 27 between them. In the present embodiment, the inner body 15' has a protrusion or flange 28 of material on two sides which extends from the body outward in opposing directions, such protrusions extending from the tip 16' of the cone to the free end of the membrane 27 where the body is placed between the two halves of the outer shell and the outer shell and the inner body are fixed together by appropriate means. In this way the inner body is mounted securely.

A further feature of this mounting method is that the conduit, or sound path, is divided into two isolated halves 29 and 30. In this manner, the maximum dimension "A" is limited to approximately 0.75 inch. The division of the height of the exit orifice into two sections allows for the reflection free upper frequency limit of transmission corresponding to the wavelength of approximately 18,000 Hz.

Accordingly, the two sound paths 31 and 32 may be bent around a radius "B" which is at least equal to or greater than ¼ (one quarter) of the wavelength of the lowest frequency to be transmitted. In this case, the lower limit is approximately 1,800 Hz which has a quarter wavelength of approximately 2.0 inches.

A further aspect of the preferred embodiment is that the pathlength of the radius "C" is shorter than the pathlength of the radius "D". A compensation is then made to the pathlength 29, which is warped or curved into the shape of pathlength shown in FIG. 5A by shaping the surface of the inner body 15' to w increase the length of the pathlength.

A further aspect of the preferred embodiment is that the exit orifice 36 thus curved may be placed immediately against the upper or lower wall of a waveguide 7 of an enclosure, as shown in FIG. 3. Two such sound chambers placed as a mirror image of one another as shown in FIG. 3, have the characteristic of acting as a single exit orifice which has double the height of the single orifice. The mirror image pair can thus radiate a single coherent wavefront without interference in the vertical plane.

An alternate embodiment of the sound chamber is that the directional change at the exit orifice is achieved by reflection as opposed to bending the wave through the curved passages previously described. It is well known that reflection of a sound wave off a flat surface is a reliable, accurate and distortion free method of changing the direction of a sound wave in a sound chamber or manifold. Further it has been shown that it is an efficient method of combining more than one compression driver in a sound chamber or manifold. In this embodiment and as shown in FIGS. 6A and 6B, the rectangular exit orifice 21" directs the wavefront to the surface of a reflector plate 38 formed as part of the shell 14'. The angle of the reflector plate is calculated to be one-half of the desired angular change in direction of the wavefront. In this embodiment the exit direction is established at 90° from the input direction and the reflector angle is set at 45°. The energy approaches the reflector plate strikes the reflector plate and emerges from the sound chamber 11'.

It is a further aspect of this embodiment of this invention that the isolation of the two halves of the sound path are not necessary, and that it is not necessary to increase the length of half of the wavefront with respect to the other half of the wavefront.

It is a further aspect of this alternate embodiment of the present invention that the wavefront within the sound chamber be so created that the wavefront is curved with respect to the direction of travel of the wavefront by the creation of an inner body and outer shell which has an elliptical characteristic as by the method previously described.

A further alternate embodiment of this invention that the reflector plate may be curved horizontally so that the center of its radius is common with the radius of the loudspeaker system. In this way the sound is more uniformly distributed at the entrance to the waveguide.

Figure 5E:
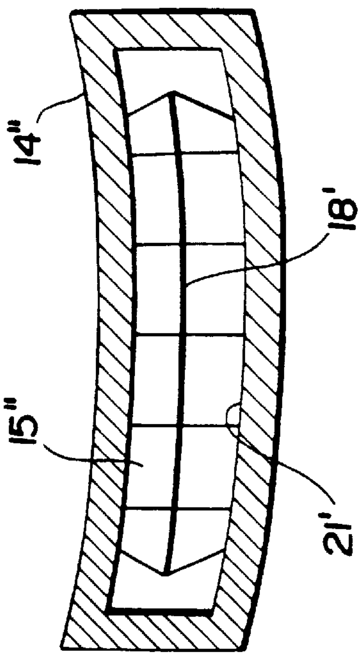
FIG. 5*e* is an end cross-sectional view of the housing and body of the embodiment shown in FIG. 5*d;*
Figure 5D:
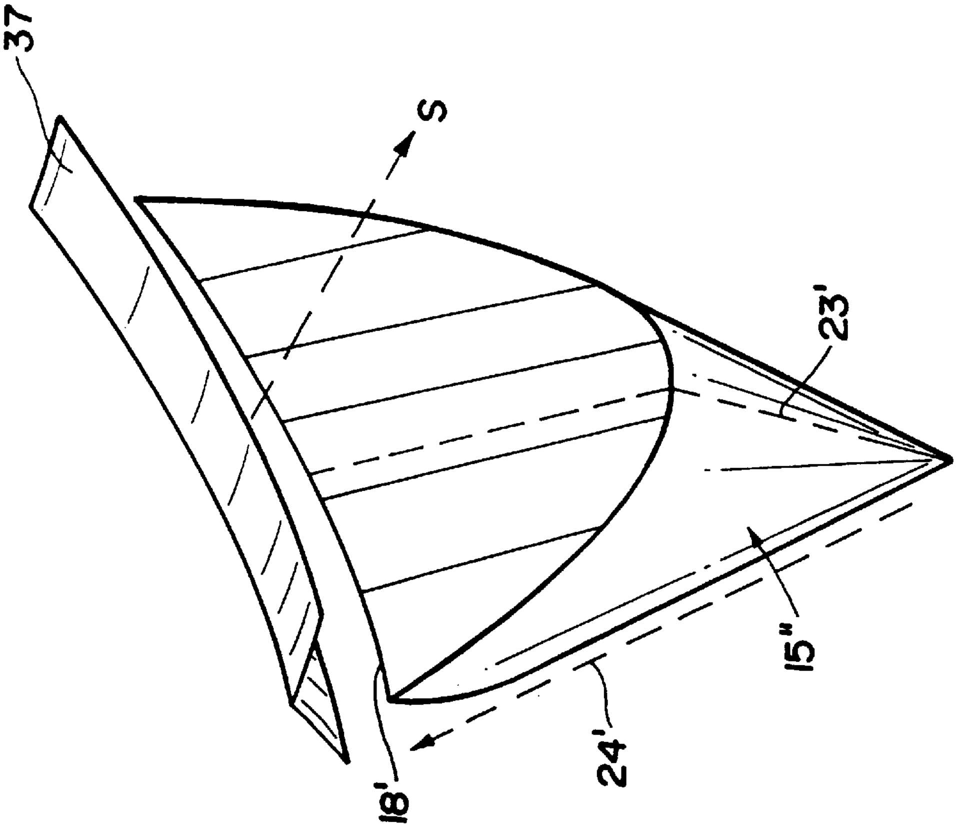
FIG. 5*d* is an alternate embodiment of body member mounted within the housing of FIGS. 5*a–c;*

It is a further aspect of the embodiment of this invention that the wavefront within the sound chamber be so created that is it planar with respect to the direction of its travel and that all the sound path lengths through the sound chamber be equal and the rectangular exit orifice 21" of the outer shell 14" and the shape of the inner body may be so curved and so shaped such that the wavefront emerges from the sound chamber as a flat wavefront with respect to its direction of travel, but curved in an arc with respect to the listener. In such a case, the body 15" is formed from a core so that the pathlengths 23' and 24' are equal, as shown in FIGS. 5D and 5E. The elongated wedge of edge 18' is slightly curved, as shown.

The curved slot thus described contains a wavefront which is flat and uncurved with respect to the direction of the wavefront. The wavefront is moving within the sound chamber 4 in a direction 90° from the direction of the wavefront within the waveguide. Its curvature prior to striking the reflector plate 37 is an arc which has the same center as the arc of the array of loudspeakers and its curvature is in a plane 90° from the direction of its travel. In this embodiment, the wavefront strikes the curved reflector plate and the sound "S" is reflected 90° prior to its entrance to the waveguide. The reflector is a constant distance from the compression driver diaphragm when any sound path is considered, but is curved in a plane 90° from the general direction of travel in the sound chamber, and curved thus with respect to the position of the listener. The curving of the wavefront in a plane 90° to the direction of its travel is then converted to a curving in the direction of travel when the wavefront is reflected from the surface of the curved reflector plate, 90° from its original direction of travel.

A further aspect of this alternate embodiment of the present invention is that two or more sound chambers may be affixed to one another, or placed in close proximity to one another in mirror imaged pairs and affixed to the entrance of a common waveguide such that the acoustic energy radiating from the combined exit orifices behaves within the waveguide substantially as though it were radiated from a single source affixed to the entrance of the common waveguide.

Mid-range Sound Chamber

Figure 7:
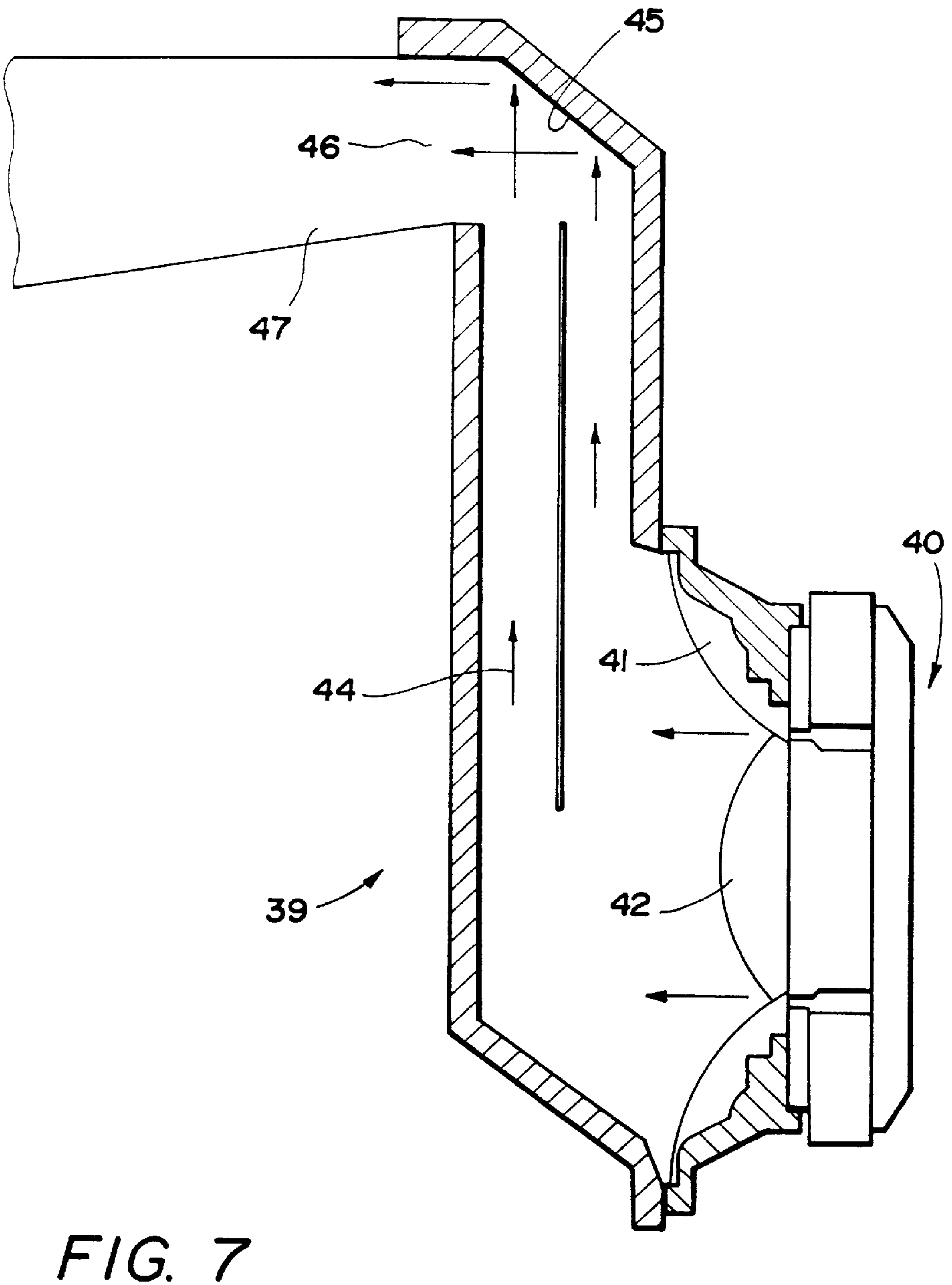
FIG. 7 is a cross-sectional view through another sound chamber of the present invention.
Figure 8:
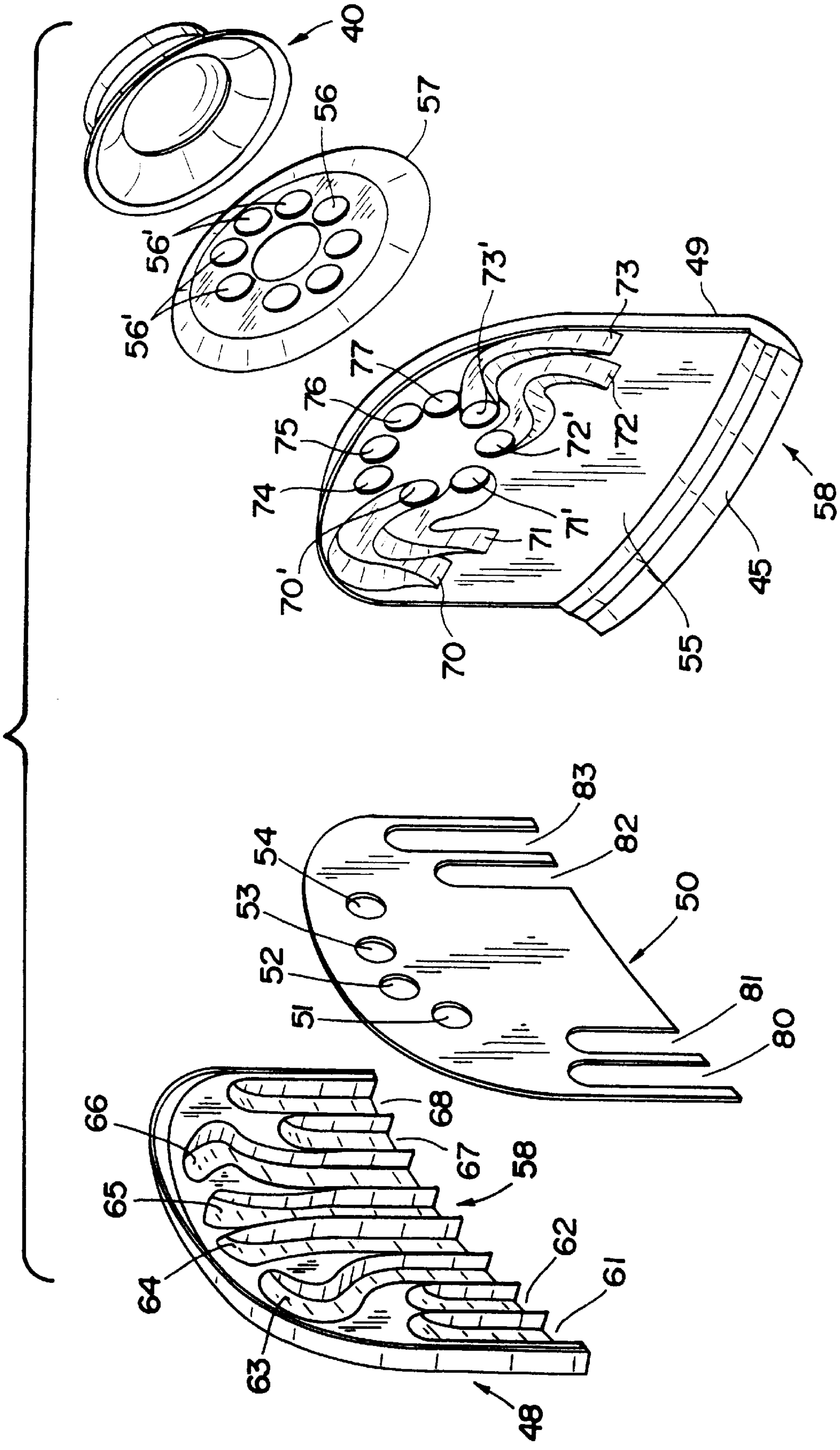
FIG. 8 is an assembly view of a mid-range sound chamber in accordance with the teachings of the present invention.
Figure 9:
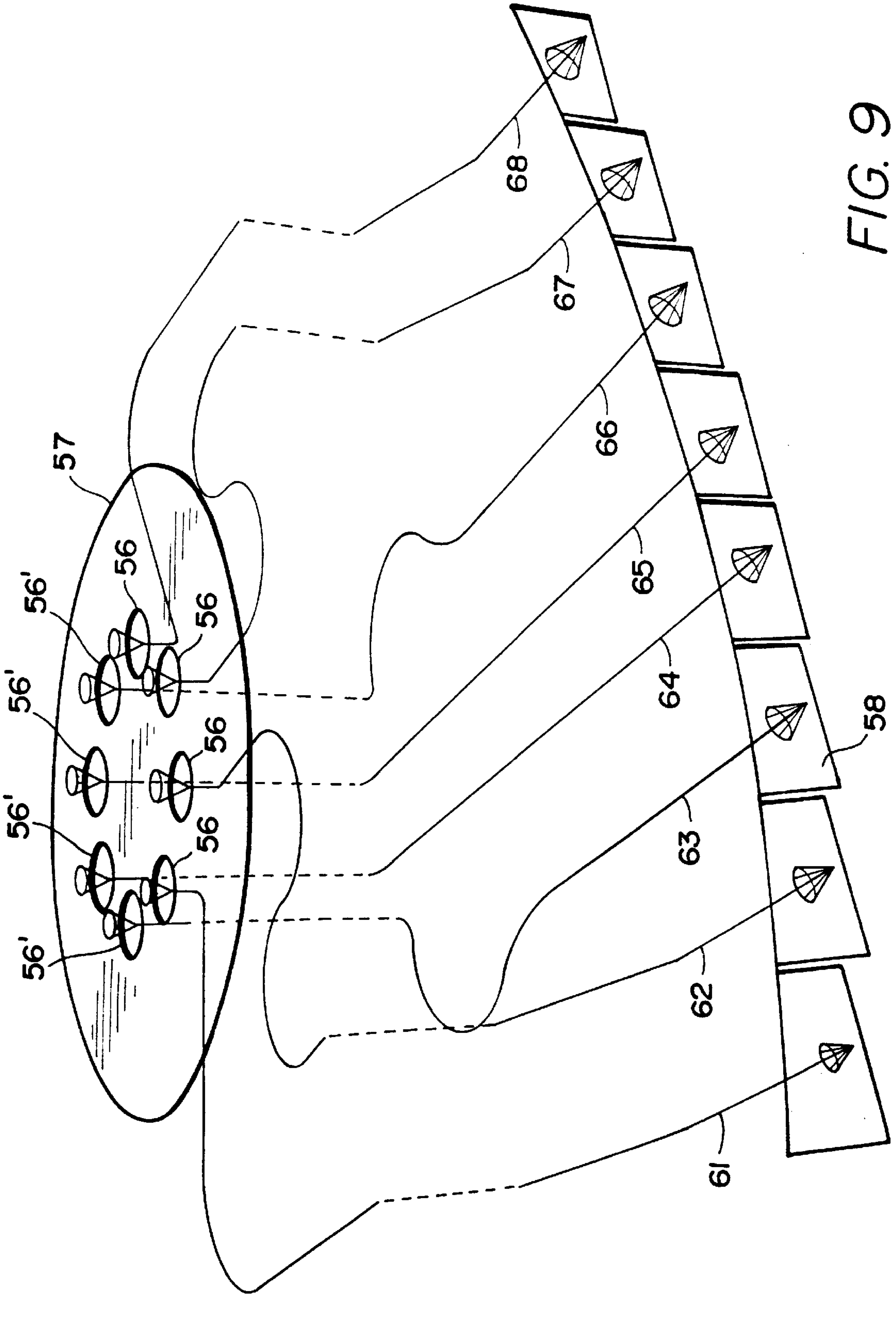
FIG. 9 is an illustrational view of the acoustical wave paths defined by the structure of sound chamber shown at FIG. 8.

With particular reference to FIGS. 7–9, a mid-range sound chamber 39 of the present invention is disclosed. The sound chamber is used with a conventional loudspeaker 40. A typical midrange loudspeaker ranges in diameter from six to twelve inches, the most popular being ten inches. It has the typical appearance of a cone 41 with a smaller dome 42 in the middle. The directional orientation of the sound in this sound chamber design is that the loudspeaker 40 is facing the listener (i.e., toward the front of the enclosure). The sound travels through a labyrinth of small, equal length passages in an upward direction 44 to a line where they all join together, then reflect from a 45° wall 45, turn 90° toward the listener and enter the curved slot entrance 46 of a waveguide 47.

A novel solution to creating the equal length passageways and the resulting phase correct curved slot from a typical cone and dome structure is as follows:

The present embodiment consists of two cast aluminum plates 48 and 49 of sufficient thickness to allow grooves or passageways to be created in the surface of each plate. Plate 48 includes eight grooves 61 through 68 and plate 49 includes four serpentine grooves 70 through 73. Passageways are created by fixing the two plates together with their grooved surfaces facing one another, separated by a thin sheet of material 50. The grooves in the two plates are thus isolated from one another by the thin sheet of material. In this manner the grooves may be created to run in various and opposing directions without encountering one another. Further, if desired, the grooves in one plate may communicate with grooves in the other plate by making openings or holes 51–54 in the dividing sheet 50. Thus, the groove of one plate may be made to communicate with a groove in the other plate.

The loudspeaker is affixed to the surface of one plate, called the mounting plate 57, on the opposite side of its grooved surface 55. A number of holes 56 are perforated through the mounting plate, oriented radially and concentric to the loudspeaker 40, adjacent the surface of the loudspeaker diaphragm. In the present embodiment, there are eight holes. All of the holes perforate the mounting plate. The half of the holes 56' which are furthest from the exit orifice 58 further communicate through the dividing sheet through holes 74–77 thus communicating with the grooves 63–66 in the surface of the second plate 48, which is called the cover plate. These grooves run directly to the exit orifice 58.

The remaining half of the holes 56 communicate directly with the grooves 70–73 in plate 49 through holes 70'–73'. The grooves in this plate then run in opposing directions and are turned in a serpentine fashion so created that all the passageways are of equal length from the surface of the loudspeaker diaphragm to the exit orifice of the sound chamber. The grooves in the mounting plate are then perforated at slots 80–83 through the dividing sheet thus communicating with further grooves 61, 62, 67 and 68 in the cover plate so that all the grooves or passageways arrive at the edge of the plates in a contiguous row. The plates are so created as to allow the plurality of passageways to form a uniform curved row or slot of radiated acoustical energy.

The curved slot thus described contains a wavefront which is flat and uncurved with respect to the direction of the wavefront. The wavefront is moving within the sound chamber in a direction 90° from the direction of the wavefront within the waveguide. Its curvature prior to striking the reflector plate 45 is an arc which has the same center as the arc of the array of loudspeakers and its curvature is in a plane 90° from the direction of its travel. In the preferred embodiment, the wavefront strikes the curved reflector plate and the sound is reflected 90° prior to its entrance 46 into the waveguide 47. The reflector is a constant distance from the midrange driver diaphragm when any sound path is considered, but is curved in a plane 90° from the general direction of travel in the sound chamber, and curved thus with respect to the position of the listener. The curving of the wavefront in a plane 90° to the direction of its travel is then converted to a curving in the direction of travel when the wavefront is reflected from the surface of the reflector plate. The movement of sound waves for this embodiment through the sound chamber is shown in FIG. 9, the length of each arrow being equal.

A further aspect of the present invention is that two or more sound chambers may be affixed to one another, or placed in close proximity to one another in mirror imaged pairs and affixed to the entrance of a common waveguide such that the acoustic energy radiating from the combined exit orifices behaves within the waveguide substantially as though it were radiated from a single source affixed to the entrance of the common waveguide.

A further aspect of the present invention is that two sound chambers may be created without reflector plates and without wavefront curvature and may be affixed to one another with a common cover plate or other means and be so created as to produce a common exit orifice.

Figure 10:
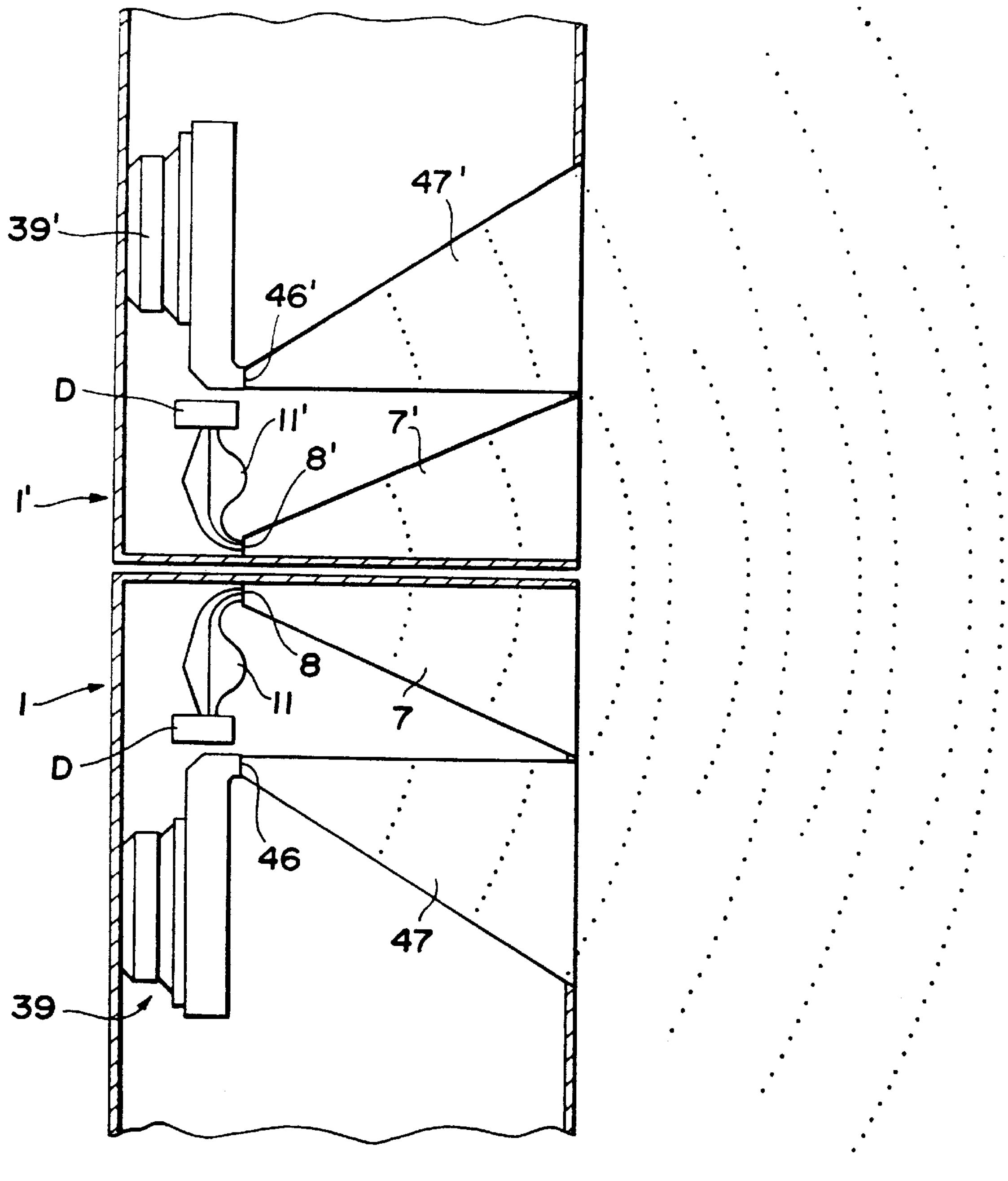
FIG. 10 is a cross-sectional illustrational view similar to that of FIG. 3 showing high frequency and mid-range sound chambers mounted to separate wave guide chambers mounted within the enclosures of the present invention.

As previously noted, the high frequency sound chamber 11 may be associated with a single waveguide, such as shown at 7 in FIG. 3, and vertical arrays may be stacked as also discussed with respect to FIG. 3. In addition, in each enclosure 1, the mid-range sound chambers 39 may be incorporated with waveguides 47. This arrangement is particularly shown in FIG. 10 in which a stacked array is also shown similar to FIG. 3.

Figure 11:
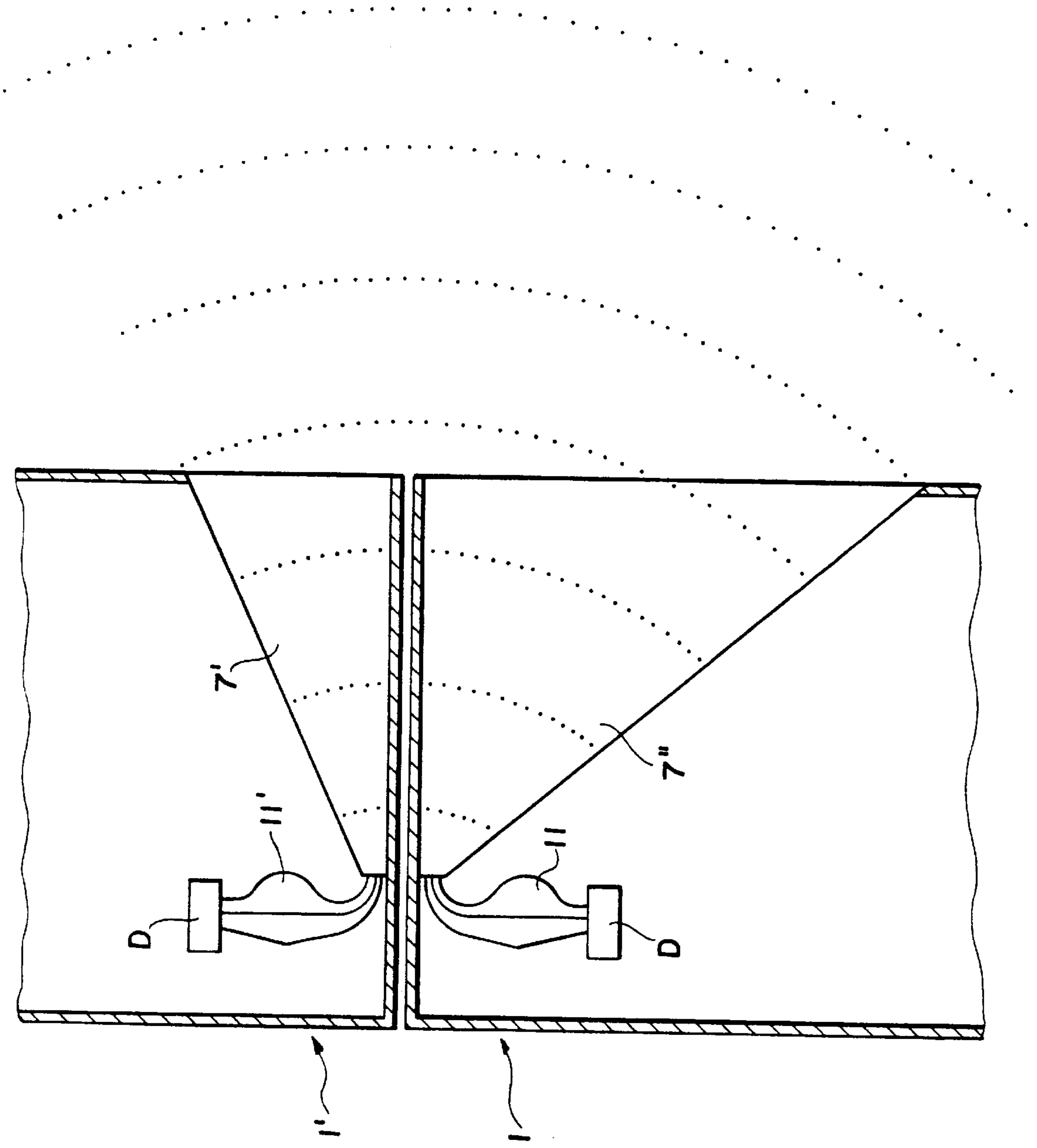
FIG. 11 is a view similar to FIG. 3 showing a variant configuration of wave guide within the enclosure of the present invention.
Figure 12:
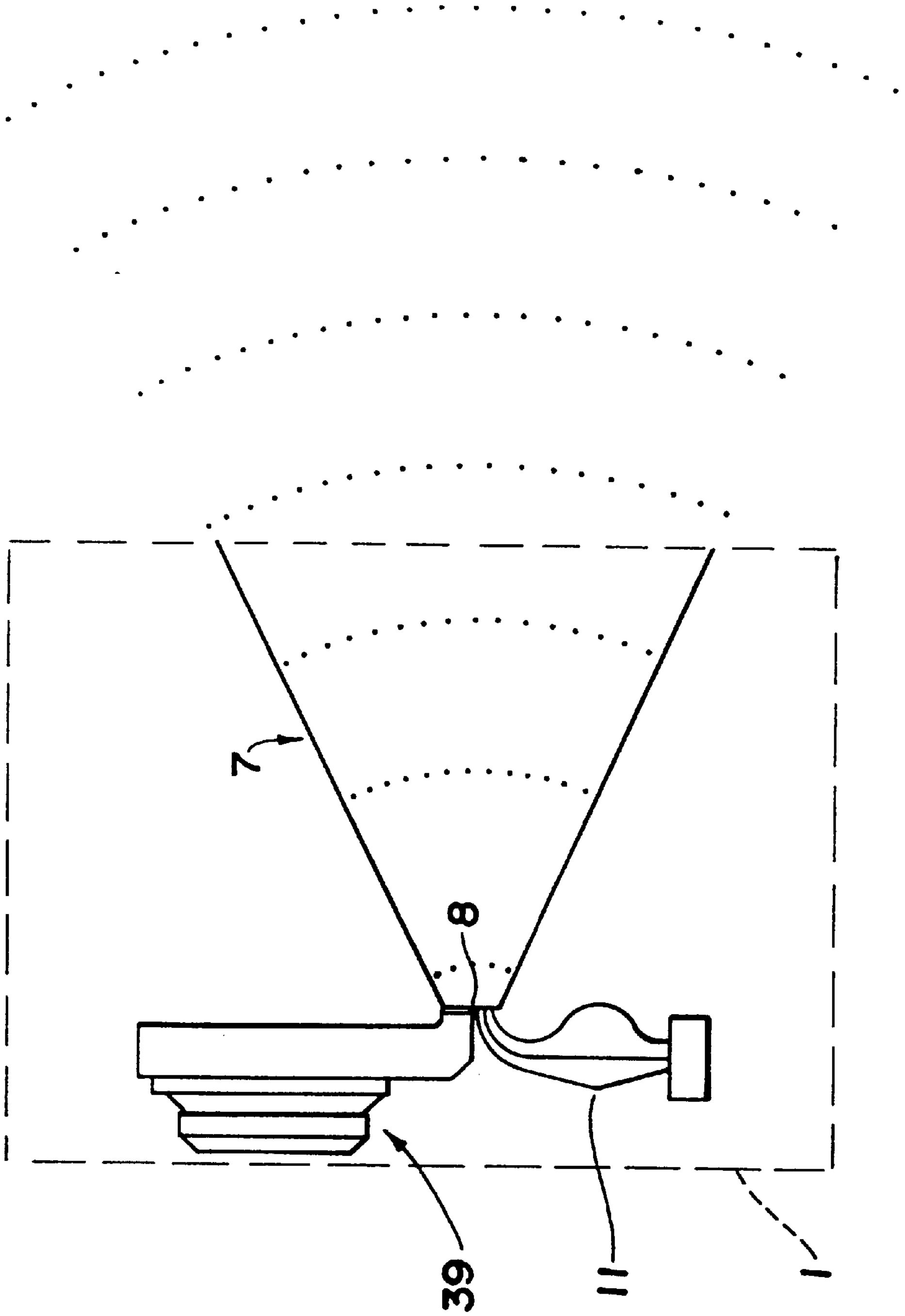
FIG. 12 is an illustrational view of a wave guide and high and mid-range sound chambers mounted to a common inlet into the wave guide in accordance with the teachings of the present invention.

In FIG. 11, a waveguide 7" is utilized with the high frequency sound chamber 11 which has a lower wall which varies in angular configuration from the lower wall of the waveguide 7'. In addition to the foregoing, as shown in FIG. 12, both the high frequency sound chamber and the mid-range sound chamber may have their output or exit orifices connected to the wave inlet 8 of a single waveguide 7. Other variations and combinations of the sound chambers 11 and 39 and of the waveguides 7 and 47 may be made in accordance with the teachings of the present invention.

What is claimed is:

1. A wave guide adapted to be placed at an output of an acoustic transducer, said wave guide comprising; an outer shell having an input orifice and an output orifice, said shell having walls of predetermined inner surface configuration, at least one inner body positioned within said outer shell, said inner body including outer surfaces of predetermined configuration which are spaced from said inner surface of said walls of said shell, said inner surfaces and said outer surfaces defining predetermined acoustic conduits connecting the input orifice to the output orifice, said input orifice having a shape which is adapted to conform with a shape of an output of the acoustic transducer and said output orifice being substantially rectangular, a plurality of acoustic paths defined along said acoustic conduits from said input orifice to said output orifice, and said plurality of acoustic paths being unequal in length and being defined such that an acoustic wave front at said output orifice is curved outwardly relative to a greater dimension of said rectangular output orifice.

2. A wave guide according to claim 1 wherein said rectangular output orifice is curved to the same extent as an acoustical wave issuing therefrom.

3. A wave guide according to claim 1 wherein said acoustic paths are of a configuration to transform a circular planar wave entering said input orifice into a curved sound wave of a constant radius and uniform width at said output orifice.

4. A wave guide according to claim 1 wherein each of said plurality of acoustic paths extending from said input orifice to said output orifice are of substantially constant width.

5. A wave guide according to claim 4 wherein said at least one inner body is shaped like a modified elliptical cone having an elliptical base and a conical axis, said inner body having a conical tip at one end and a wedge defined by two converging planar faces at an opposite end, said elliptical base including a major elliptical axis and a minor elliptical axis, said conical axis extending from approximately a center of said body to said tip, said planar faces extending from a line which defines said major axis of said ellipse to substantially the midpoint along opposite sides of said elliptical cone and said conical axis being substantially in alignment with said input orifice and said output orifice of said outer shell.

6. A wave guide according to claim 5 wherein said outer shell includes two symmetrical half shells joined together, said half shells being symmetrical about a plane, said plane lying on said primary axis, said plane being oriented in the direction of said greater dimension of the said rectangular output orifice.

7. A wave guide according to claim 6 wherein a first plurality of said acoustic paths of different lengths defined between one of the said half shells and said inner body are of a length which is longer than the lengths of a second plurality of acoustic paths of different lengths defined between the other of said half shells.

8. A wave guide according to claim 7 wherein said first and second plurality of acoustic paths defined by said two half shells are so shaped and extended such that, at said rectangular output orifice, they are bent to an angle other than zero degrees from a primary elongated axis of said inner body.

9. A wave guide according to claim 1 wherein said at least one inner body is shaped like a modified elliptical cone having an elliptical base and a conical axis, said inner body having a conical tip at one end and a wedge defined by two converging planar faces at an opposite end, said elliptical base including a major elliptical axis and a minor elliptical axis, said conical axis extending from approximately a center of said body to said tip, said planar faces extending from a line which defines said major axis of said ellipse to substantially the midpoint along opposite sides of said elliptical cone and said conical axis placed substantially in alignment with said input orifice and said output orifice of said outer shell.

10. A wave guide according to claim 9 wherein said outer shell includes two symmetrical half shell joined together, said half shells being symmetrical about a plane, said plane lying on said primary axis, said plane being oriented in the direction of said greater dimension of the said rectangular output orifice.

11. A wave guide according to claim 10 wherein a first plurality of said acoustic paths of different lengths defined between one of the said half shells and said inner body are of a length which is longer than the lengths of a second plurality of acoustic paths of different lengths defined between the other of said half shells.

12. A wave guide according to claim 11 wherein said first and second plurality of acoustic paths defined by said two half shells are so shaped and extended such that, at said rectangular output orifice, they are bent to an angle other than zero degrees from a primary elongated axis of said inner body.

13. A plurality of waveguides wherein each wave guide is adapted to be placed at an output of an acoustic transducer, each wave guide comprising; an outer shell having an input orifice and an output orifice, said shell having walls of predetermined inner surface configuration, at least one inner body positioned within said outer shell, said inner body including outer surfaces of predetermined configuration which are spaced from said inner surface of said walls of said shell, said inner surfaces and said outer surfaces defining predetermined acoustic conduits connecting the input orifice to the output orifice, said input orifice having a shape which is adapted to conform with a shape of an output of the acoustic transducer and said output orifice being substantially rectangular, a plurality of acoustic paths defined along said acoustic conduits from said input orifice to aid output orifice, and said plurality of acoustic paths being unequal in length and being defined such that an acoustic wave front at said output orifice is curved outwardly relative to a greater dimension of said rectangular output orifice.

* * * * *